United States Patent
Ibi et al.

[11] Patent Number: 5,955,766
[45] Date of Patent: *Sep. 21, 1999

[54] DIODE WITH CONTROLLED BREAKDOWN

[75] Inventors: Takao Ibi; Katsu Honna, both of Kanagawa-ken, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/662,204

[22] Filed: Jun. 12, 1996

[30] Foreign Application Priority Data

Jun. 12, 1995 [JP] Japan ................................. 7-144626

[51] Int. Cl.$^6$ ................................................. H01L 29/76
[52] U.S. Cl. ........................ 257/367; 257/603; 257/605
[58] Field of Search ............................... 257/367, 529, 257/530, 603, 605, 366, 488

[56] References Cited

U.S. PATENT DOCUMENTS

| | | | |
|---|---|---|---|
| 3,740,689 | 6/1973 | Yamasjita | 338/2 |
| 3,767,981 | 10/1973 | Polata | 317/235 R |
| 4,713,681 | 12/1987 | Beasom | 357/52 |
| 5,274,259 | 12/1993 | Grabowski et al. | 257/327 |
| 5,382,819 | 1/1995 | Honjo | 257/371 |
| 5,547,303 | 8/1996 | Terashima et al. | 257/401 |

FOREIGN PATENT DOCUMENTS

Kokai H6-151897  5/1994  Japan .

OTHER PUBLICATIONS

Wolf "Silicon Processing V2", pp. 199, 274, 1990.

*Primary Examiner*—Donald L. Monin, Jr.
*Assistant Examiner*—Douglas A. Wille
*Attorney, Agent, or Firm*—Oblon, Spivak, McClelland, Maier & Neustadt, P.C.

[57] ABSTRACT

A zapping diode concerned with a P-N junction diode provided in an integrated circuit, whose P-N junction is subjected to breakdown by an overvoltage to perform fine adjustment in the value of capacitance or resistance involved in the circuit. The diode has a first impurity region of a first conductivity type formed in a first conductivity type semiconductor region, a second impurity region, an interlayer insulation film formed over the semiconductor region, and a third conductor film formed on the semiconductor region between the first and second impurity region. The third conductor film, when applied by a reverse-bias voltage, controls the direction of breakdown in the P-N junction to thereby provide a consistent value of residual resistance.

32 Claims, 4 Drawing Sheets

DIODE WITH CONTROLLED BREAKDOWN

BACKGROUND OF THE INVENTION

1. Field of the Invention

The present invention relates to a semiconductor device, and more particularly to a diode used to perform fine adjustment on the value of resistance in an electronic circuit by zapping.

2. Description of the Related Art

There are often cases where fine adjustment is performed on the value of resistance involved in an integrated circuit by an overvoltage applied to a P-N junction diode provided in the circuit to cause breakdown in a P-N junction thereof. This fine adjustment is called "zapping" or "zener zap", and a diode for use in such zapping is called a "zapping diode".

There is illustrated in FIG. 1 a top plan view showing a structure of a conventional zapping diode, while FIG. 2 is a cross-sectional view taken on line II—II in FIG. 1. As shown in these figures, a P-type region 12 is formed to be encompassed by a device-isolation layer 10 in an N-type semiconductor substrate 11. Formed in the surface of P-type region 12 in a P+-type region 13 and an N+-type region 14, both having a high impurity concentration. Aluminum interconnections 15 are provided respectively in electrical connection to the P+-type region 13 and the N+-type region 14 through each contact hole 17.

FIG. 3 is a circuit diagram showing an example of a circuit including a zapping diode. A resistance 31 is connected in parallel with the zapping diode 32. When zapping is performed to finely adjust the value of resistance 31 which is involved in an electronic circuit, an overvoltage under reverse-bias 20 is applied to the zapping diode 32, as shown in FIG.2. By thus zapping, an electronic circuit having a breakdown path or an electric current path which has an appropriate value of residual resistance is formed in the zapping diode.

However, a problem remains in the above-stated structure. When the P-N junction is broken down by a reverse-biased voltage, there exists no directionality in the junction breakdown, as shown in a top plan view of FIG. 4 wherein the arrows 41, 42, and 43 indicate directions of junction breakdown, for example The location where the electric current passage forms varies. That is, sometimes it forms along the solid line 41 and othertimes along the broken line 42 or 43. This is because a breakdown path, or an electric current path, it is to be formed where the electric field is mostly concentrated, with the result that breakdown occurs in direction that inconsistently differs from time to time. As a result, there may be a case where the length of the current path, which forms as a result of the junction breakdown from the P+-type region 13 to the N+-type region 14, is variable, and accordingly a consistent desired value of residual resistance is not obtainable by usual zapping. Moreover, the voltage at which junction breakdown occurs differs from time to time, so that it may cause damage to the other circuit elements which are connected to the zapping diode.

In this manner, the conventional zapping diode has the problem that the value of residual resistance after breakdown inconsistently varies due to the absence of directionality of breakdown in a P-N junction.

SUMMARY OF THE INVENTION

It is therefore an object of the invention to provide a semiconductor device having a zapping diode which is capable of providing consistency in the value of residual resistance after breakdown. It is a further object to cause no damage to other curcuit elements during the zapping operation.

These and other objects of the invention are achieved by a structure given hereinbelow.

A semiconductor device comprising:

a first impurity region formed in the surface of a semiconductor region;

a second impurity region formed in said surface and spaced from said first impurity region;

an insulation film formed over surface of said semiconductor region;

first and second conductor films electrically connected respectively to said first and second impurity regions; and a third conductor film formed between said first and second impurity regions and over a part of said semiconductor region, said third conductor film being electrically connected to said first conductor film.

DETAILED DESCRIPTION OF THE PREFERRED EMBODIMENTS

Figure 1:
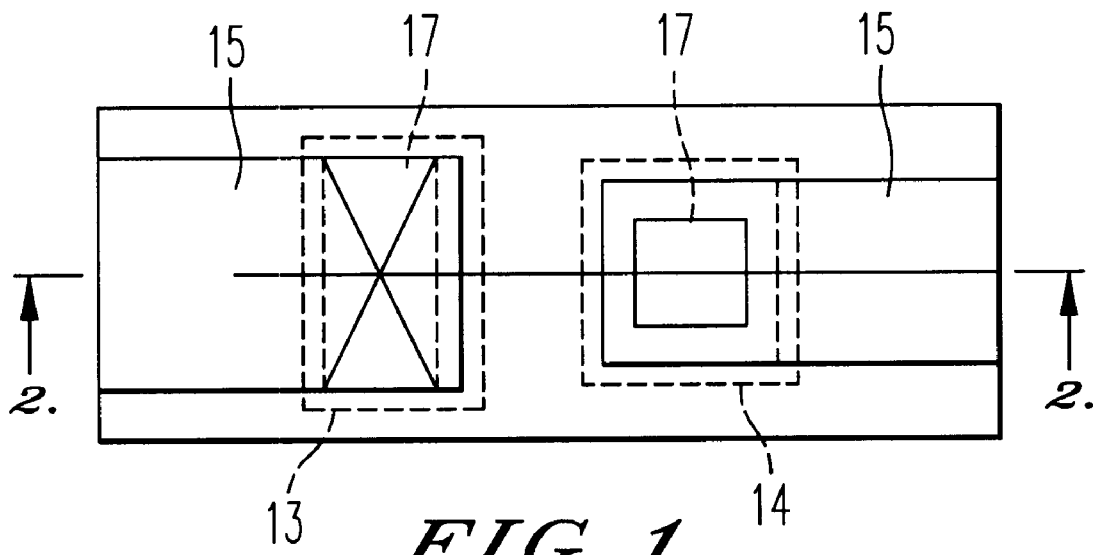
FIG. 1 is a top plan view showing a structure of a conventional zapping diode.
Figure 2:
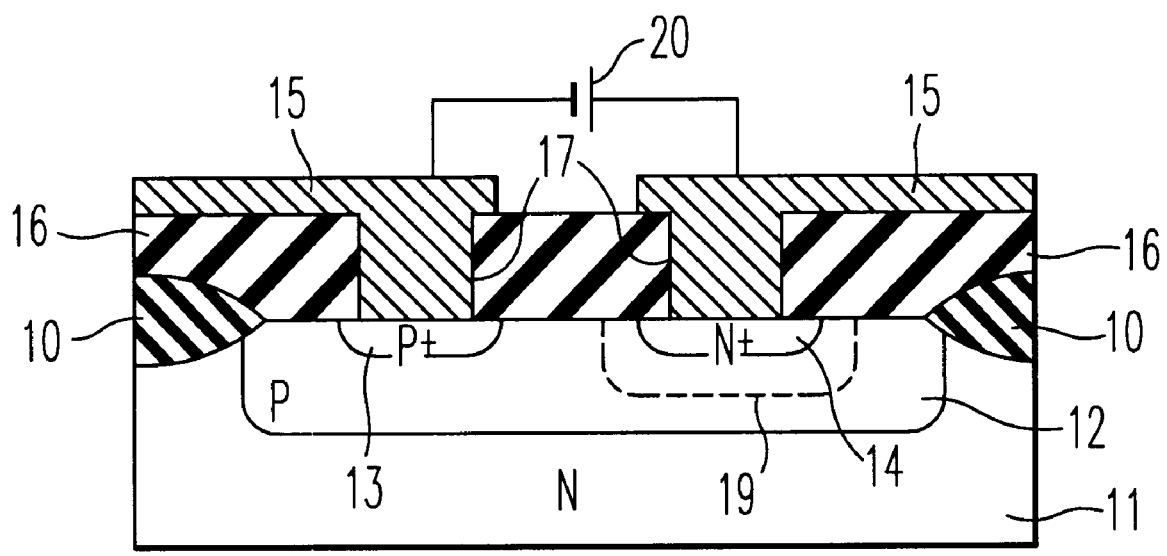
FIG. 2 is a cross-sectional view taken an line II—II in FIG. 1.
Figure 3:
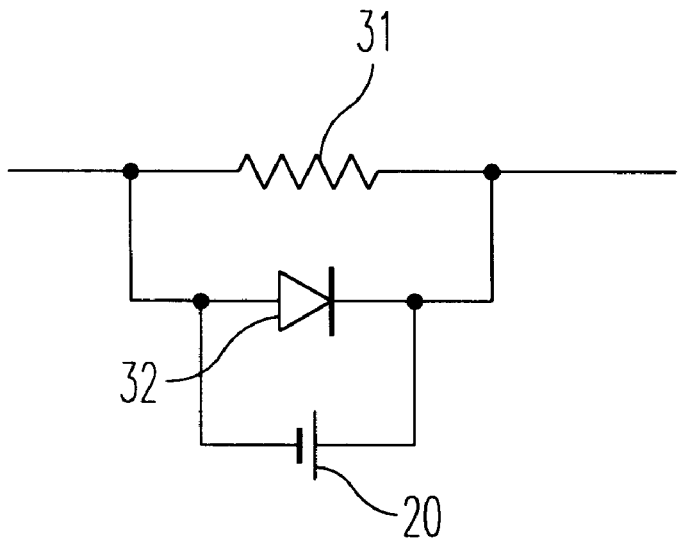
FIG.3 is a circuit diagram showing an example of curcuit including zapping diode.
Figure 4:
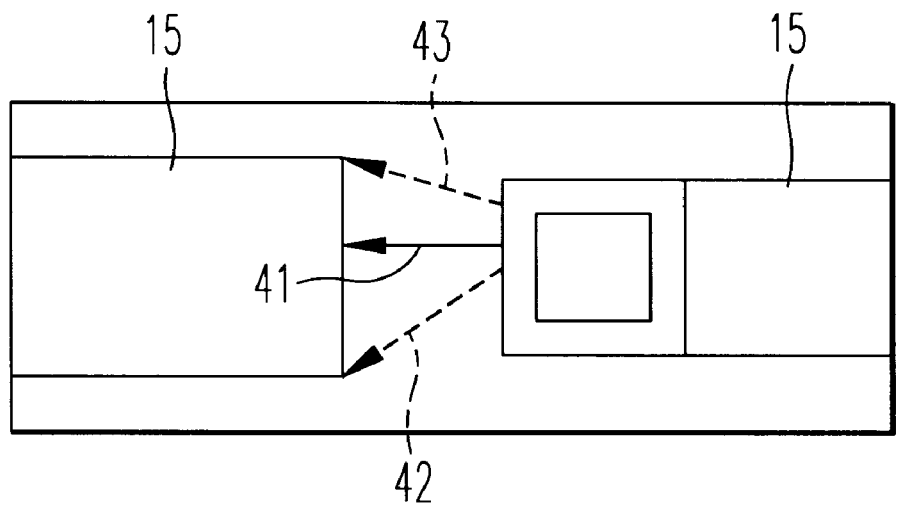
FIG. 4 is a top plan view showing junction breakdown in the conventional zapping diode.
Figure 5:
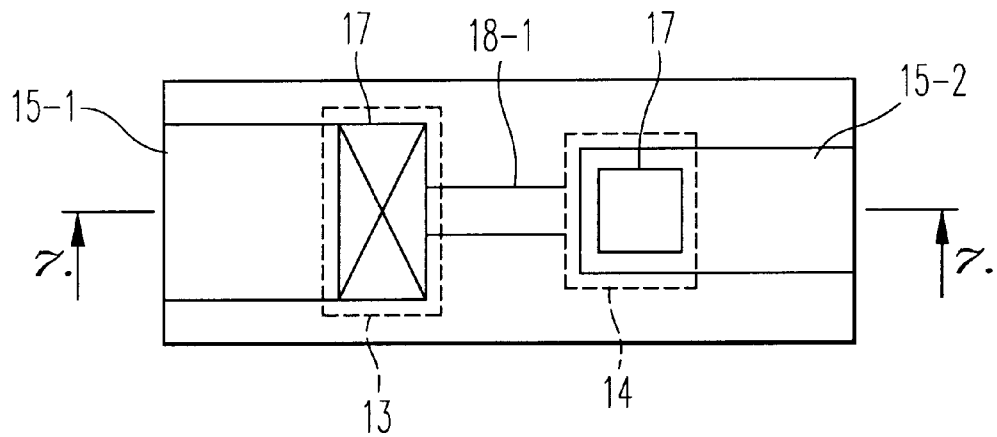
FIG. 5 is a top plan view showing a structure of a zapping diode according to a first embodiment of the invention.
Figure 6:
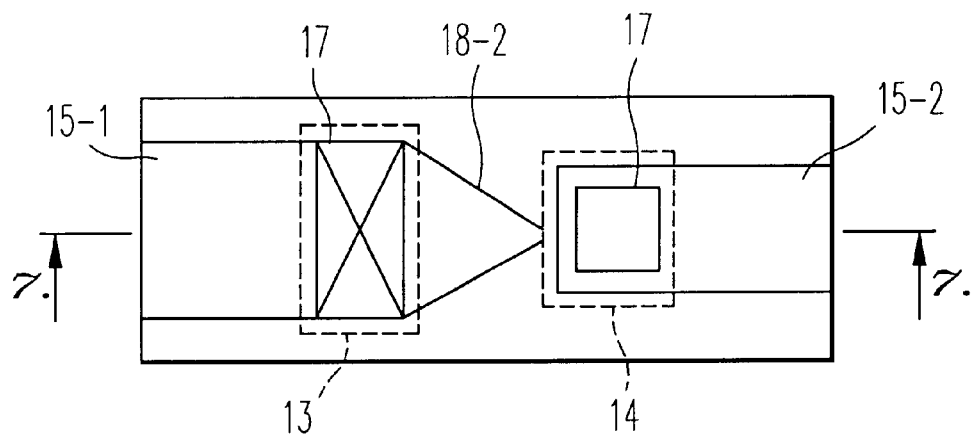
FIG. 6 is a top plan view showing a structure of a zapping diode according to a second embodiment of the invention.
Figure 7:
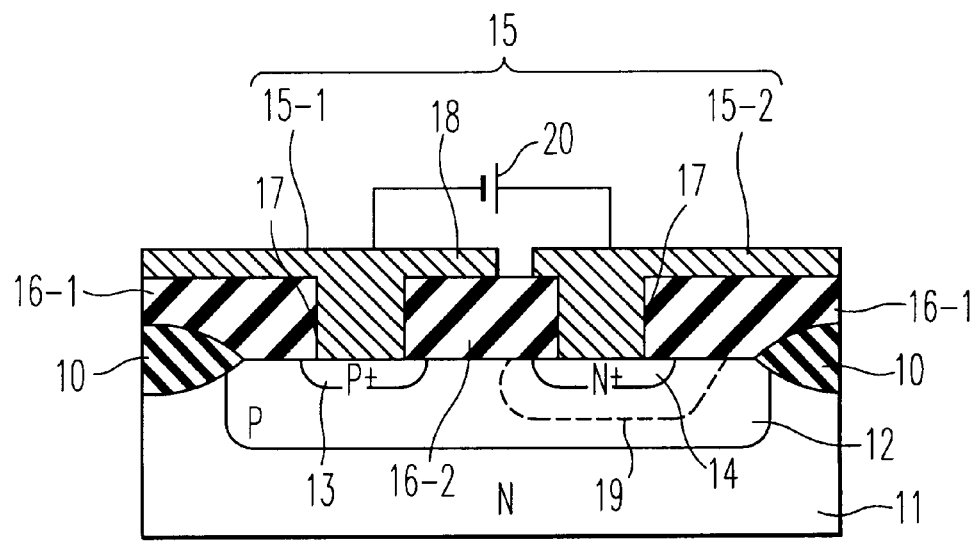
FIG. 7 is a cross-sectional view taken on line VII—VII in FIG. 4 and FIG. 6.

FIG. 5 is a top plan view illustrating the structure of a zapping diode according to a first embodiment of the invention. FIG. 6 is a top plan view illustrating the structure of a zapping diode according to a second embodiment of the invention. FIG. 7 is a cross-sectional view taken on line VII—VII FIG. 5 and FIG. 6. As shown in these figures, a P-type region 12 is formed encompassed by a device-isolation layer 10 in an N-type substrate 11. Formed in the surface of P-type region 12 is P+-type region 13 and N+-type region 14, both having high impurity concentration. The insulation film 16-1 is formed over surface of the P-type region 12 and the device-isolation layer 10. The insulation film 16-2 is formed over surface of the P-type region 12 which located between P+-type region 13 and the N+-type region 14.

As an example, the insulation film 16-1 and 16-2 are formed of SiO2 or Si3N4, and the thickness in about 1 $\mu$m. Furthermore, the insulation film 16-2 is preferably formed of Si3N4, because the dielectric constant of Si3N4 is higher than that of SiO2. Forming insulation film 16-2 by Si3N4, it is easier to concentrate the electric field than the case where insulation film 16-2 is formed of SiO2 as explained below.

Aluminum interconnections 15 are connected respectively to the P+-type region 13 and the N+-type region 14 through respective contact holes 17 formed in the interlayer insulation film 16. The aluminum interconnections 15 include an interconnection 15-1 which is provided on the side of connection to the P+-type region 13. The interconnection 15-1 has a part thereof formed over the P-type region 12 separated therefrom by the interlayer insulation film 16 projecting toward aluminum interconnection 15-2 connected to the N+-type region 14. This part of 15-1 is hereinafter referred to as "a junction-breakdown direction-control part" 18, since it serves to control the direction in which breakdown takes place through the P-N junction.

The difference between the first embodiment and the second embodiment is in the shape of the junction-breakdown direction-control part 18. In the first embodiment, the shape of the junction-breakdown direction-control part 18-1 is rectangular. In the second embodiment, the shape of the junction-breakdown direction-control part 18-2 is; triangular. One of vertices of triangular part 18-2 is shown connected to aluminum interconnection 15-1. It is desirable that the edge of the junction-breakdown direction-control parts 18-1 and 18-2 are aligned with an edge of the N+-type region 14.

With the structure stated above, the P-N junction diode is subjected to zapping by applying a reverse-bias voltage 20 to cause breakdown in the P-N junction thereof as shown in FIG. 7. A negative potential is applied to aluminum interconnection 15-1. The negative potential is also applied to the junction-breakdown direction-control part 18, which constitutes a part of the aluminum interconnection 15-1. For the device dimensions of this example, a value of the reverse-bias voltage 20 is about 10V.

That is, when the reverse-bias voltage 20 is applied, the junction-breakdown direction-control part 18 attracts positive holes toward the surface of the P-type region 12 in the region located below the junction-breakdown direction-control part 18. To this end, a depletion layer 19, which is created by the reverse-bias voltage 20 to extend along the junction between the N+-type region 14 and the P-type region 12, is forced back toward the N+-type region 14.

Consequently, there is brought about a region where no depletion layer 19 is present or the extent of depletion is suppressed, in the P-type region 12 below the junction-breakdown direction-control part 18. As a result, the electric field is concentrated this region, so that breakdown occurs in the semiconductor region extending below the junction-breakdown direction-control part 18.

The depletion layer 19, which extends along the P-N junction in the semiconductor region, is controlled at the location below the junction-breakdown direction-control part 18 by applying a reverse-bias voltage 20 to the aluminum interconnection 15-1 and the junction-breakdown direction-control part 18 extending from the interconnection 15-1. Thus, the breakdown is directional in the zapping operation to break down the P-N junction. The deviation in value of residual resistance after breakdown can be controlled to be the desired value. Furthermore, depletion layer 19 is forced back toward the N+-type region 14, in other words, depletion layer 19 becomes narrowed. Thus, the P-N junction-breakdown occurs at a lower reverse-bias voltage than that of the prior art structures. In view of this, no damage is caused to the other circuit elements when zapping.

Incidentally, to implement the part 18 in these embodiments requires only a change to the mask pattern for patterning the aluminum interconnections 15, so that the invention does not increase the number of process steps.

Figure 8:
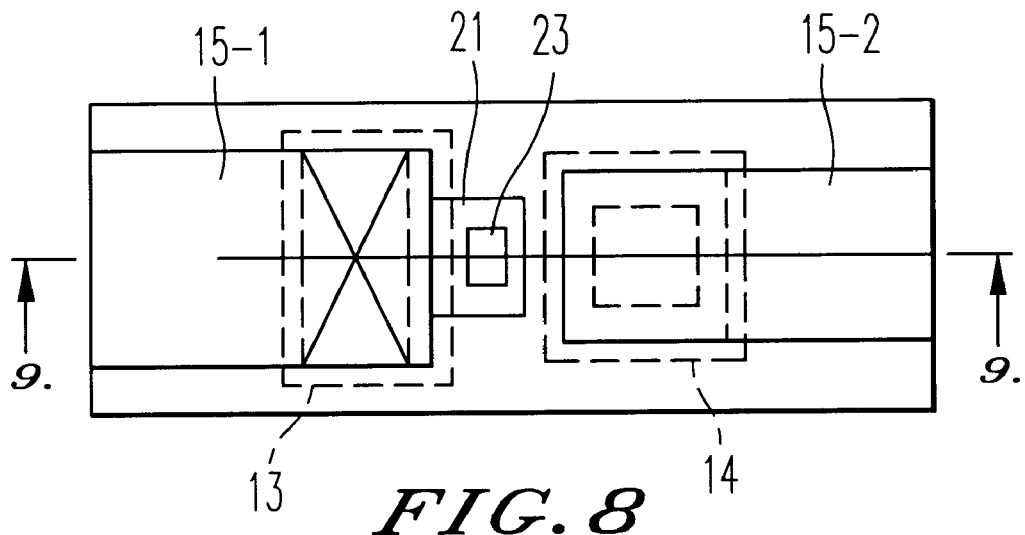
FIG. 8 is a top plan view showing a structure of a zapping diode according to a third embodiment of the invention.
Figure 9:
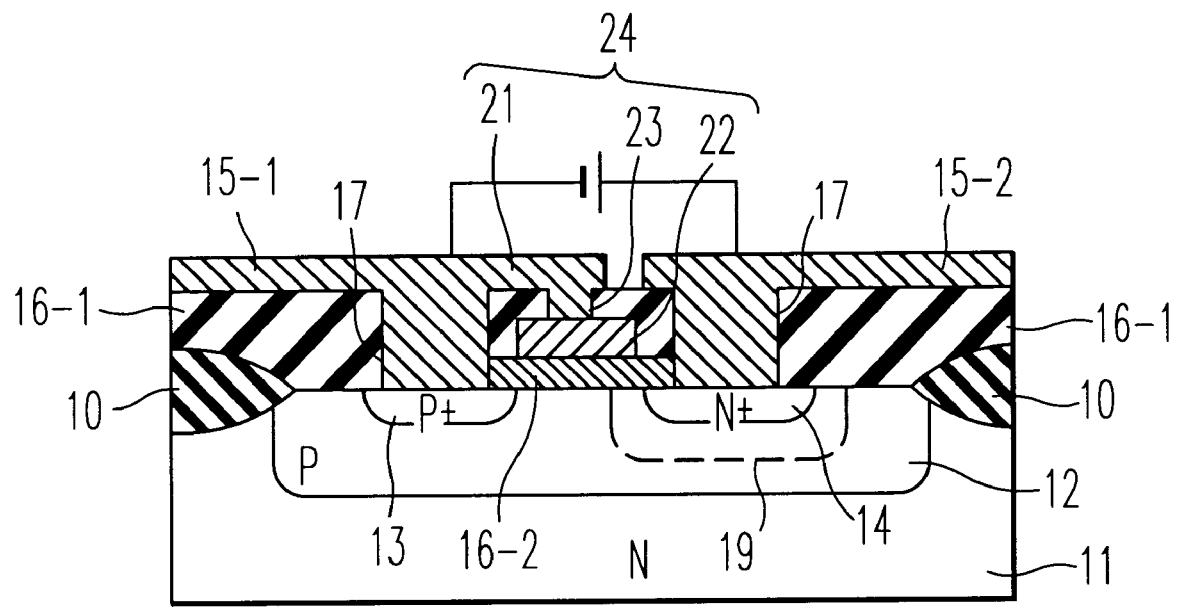
FIG. 9 is a cross-sectional view taken on line IX—IX in FIG. 8.

FIG. 8 is a top plan view showing a structure of a zapping diode according to a third embodiment of the invention. FIG. 9 is a cross-sectional view taken on line IX—IX in FIG. 8. In these figures, the same reference numerals are given to the similar parts to those of the first and second embodiments. The third embodiment is different from the first and second embodiments in respect of the structure of the junction-breakdown direction-control part. The aluminum interconnection 15-1 has a part 21 thereof extending toward the opposing aluminum interconnection 15-2. The portion 21 is electrically connected through a via-hole 23 to a field plate 22 provided within an interlayer insulation film 16. The insulation film 16 can be formed of SiO2 or Si3N4, and the thickness is about 1 μm. As mentioned above, the insulation film 16-2 under the field plate 22 is preferably formed of Si3N4 and it is desirable that the edge of the field plate 22 is aligned or substantially aligned with an edge of the N+-type region 14. The field Plate 22 is formed of polysilicon, for example.

With the structure as stated above, a junction-breakdown direction-control part 24 is formed by the part 21 selectively extending from the aluminum interconnection 15-1 and the field plate 22 is connected thereto. Consequently, during applying a reverse-bias voltage 20, the depletion layer 19 is suppressed from extending toward the semiconductor region below the junction-breakdown direction-control part 24. Thus, the breakdown is directional in the zapping operation to break down the P-N junction. The deviation in the value of residual resistance after breakdown can be controlled to be the desired value. Also it cause no damage to the other circuit element during zapping treatment.

The third embodiment has the field plate 22 provided closer to the P-type region 12, as compared with the first and second embodiments, so that the control in directivity of junction breakdown is enhanced in accuracy. The field plate 22, if provided in a circuit having a MOS transistor, is formable through a process common to the formation of a MOS transistor gate electrode. In such a case, the formation of the field plate 22 does not increase the number of process steps.

Incidentally, the present invention is not limited to the abovestated embodiments. Alternatively, an N-type region and N+-type region may be employed respectively in place of P-type region 12 and P+-type region 13. In such a case, a biased voltage for causing junction breakdown is reverse in polarity to that of the embodiments. An effect is obtainable similarly to that of the embodiments. Also, while alignment of the projecting edge of the junction-breakdown direction-control part with the impurity region is preferred, the invention is not so limited, In other words, the alignment can vary and invention can still be practiced. The alignment can vary due to processing tolerances, processing conditions, etc, such that substantial alignment is achieved. The degree of alignment can also vary based upon the precision of the residual resistance that is desired. The alignment needed to carry out the invention is that necessary to consistently control the value of the residual resistance during the zapping process.

What is claimed is:

1. A semiconductor device, comprising:
    a first impurity region of a first conductivity type formed in a surface of a semiconductor region;
    a second impurity region of a second conductivity type formed in said surface and spaced from said first impurity region;

an insulation film formed over said surface of said semiconductor region;

first and second conductor films electrically connected respectively to said first and second impurity regions; and a third conductor film formed between said first and second impurity regions and over a part of said semiconductor region, said third conductor film being electrically connected to said first conductor film wherein an edge of said third conductor film is substantially aligned with an edge of said second impurity region.

2. A semiconductor device according to claim 1, wherein said first and second conductor films are electrically connected respectively to said first and second impurity regions through contact holes formed in said insulation film.

3. A semiconductor device according to claim 1, wherein said third conductor film is formed on said insulation film.

4. A semiconductor device according to claim 1, further including a fourth conductor film electrically connected to said third conductor film and formed within said insulation film between said first and second impurity regions.

5. A semiconductor device according to claim 1, wherein said third conductor film is formed on a first portion of said insulation film that is thinner than a second portion of said insulation film under said first conductor film.

6. A semiconductor device according to claim 1, wherein said third conductor film is integrally formed with said first insulation film.

7. A semiconductor device according to claim 1, wherein said third conductor film is formed within said insulation film.

8. A semiconductor device according to claim 1, wherein said third conductor film is formed of polysilicon.

9. A semiconductor device according to claim 1, wherein a shape of said third conductor film is one of rectangular and triangular.

10. A device according to claim 9, comprising:

said shape being substantially triangular with a portion opposing an edge of said second impurity region.

11. A semiconductor device according to claim 1, wherein a part of said insulation film located under said third conductor film is formed of Si3N4.

12. A device according to claim 9, comprising:

said third conductor film extending over said semiconductor region substantially from said first impurity region to said second impurity region.

13. A device as recited in claim 12, comprising:

said triangular shape having a vertices substantially aligned with an edge of said second impurity region.

14. A device according to claim 9, comprising:

said third conductor film extending over said semiconductor region substantially from said first impurity region to said edge of said second impurity region.

15. A semiconductor device comprising:

a first impurity region of a first conductivity type formed in a surface of a semiconductor region;

a second impurity region of a second conductivity type formed in said surface and spaced from said first impurity region;

an insulation film formed over said surface of said semiconductor region between said first and second impurity regions;

reverse-bias voltage applying means having one end thereof electrically connected to said first impurity region and another end thereof electrically connected to said second impurity region; and a junction-breakdown direction-control part selectively formed on said insulation film, where said junction-breakdown direction-control part controls the direction of junction breakdown in said semiconductor region between said first and second impurity regions;

wherein an edge of aid junction-breakdown direction-control part is substantially aligned with an edge of said second impurity region.

16. A semiconductor device according to claim 15, wherein said junction-breakdown direction control section is connected to an end of said reverse-bias voltage applying means.

17. A semiconductor device according to claim 15, wherein said junction-breakdown direction-control part suppresses formation of a depletion layer associated with said second impurity region.

18. A semiconductor device according to claim 15, wherein said junction-breakdown direction-control part is formed within said insulation film.

19. A semiconductor device according to claim 15, wherein said junction-breakdown direction-control part is formed on a first portion of said insulation film that is thinner than a second portion of said insulation film under reverse-bias voltage applying means.

20. A semiconductor device according to claim 15, wherein said junction-breakdown direction-control part attract carriers of the same type as first impurity region toward a surface of said semiconductor region located below said junction-breakdown direction-control part.

21. A semiconductor device according to claim 15, wherein a part of said insulation film located under said junction-breakdown direction-control part is formed by one of a high dielectric constant material and Si3N4.

22. A device according to claim 15, wherein said part concentrates an electric field in a selected portion of a depletion region associated with said second impurity region.

23. A device according to claim 15, comprising:

said creating, in a depletion region associated with said second impurity region, a region of preferential junction breakdown having a desired size to control the direction and location of said junction breakdown.

24. A device as recited in claim 18, comprising:

said junction-breakdown direction-control part controls a direction of junction breakdown occurring in said semiconductor region between said first and second impurity regions.

25. A device as recited in claim 18, comprising:

said junction-breakdown direction-control part controls a direction of junction breakdown proximate to a surface of said semiconductor region between said first and second impurity regions.

26. A semiconductor device, comprising:

a semiconductor region of a first conductivity type;

a first impurity region of a first conductivity type formed proximate to a surface of said semiconductor region and having an impurity concentration higher than that of said semiconductor region;

a second impurity region of a second conductivity type formed proximate to said surface of said semiconductor region and spaced from said first impurity region;

an insulation film formed over said surface of said semiconductor region between said first and second impurity regions; and a conductor film electrically connected to said first impurity region and having a portion projecting over a predetermined portion of said surface of said semiconductor region between said first and second impurity regions toward said second impurity region said portion of said conductor film projecting over said surface of said semiconductor region between said first and second impurity regions substantially to an edge of said second impurity region.

27. A device according to claim 28, comprising:

said portion of said conductor film projecting over a substantial portion of said surface of said semiconductor region between said first and second impurity regions toward said second impurity region.

28. A device according to claim 26, comprising:

said portion of said conductor film being aligned with a predetermined portion of an opposing edge of said second impurity region.

29. A device according to claim 20, comprising:

said portion of said conductor film projecting over said surface of said semiconductor region between said first and second impurity regions substantially to an edge of said second impurity region.

30. A device according to claim 29, comprising:

only said portion of said conductor film projecting over said surface of said semiconductor region between said first and second impurity regions substantially to said edge of said second impurity region.

31. A semiconductor device comprising:

a first impurity region of a first conductivity type formed in a surface of a semiconductor region;

a second impurity region of a second conductivity type formed in said surface and spaced from said first impurity region;

an insulation film formed over said surface of said semiconductor region between said first and second impurity regions;

reverse-bias voltage applying means having one end thereof electrically connected to said first impurity region and another end thereof electrically connected to said second impurity region; and a junction-breakdown direction-control part selectively formed on said insulation film, where said junction-breakdown direction-control part controls the direction of junction breakdown in said semiconductor region between said first and second impurity regions;

wherein said part suppresses an extent of a selected portion of a depletion region associated with said second impurity region; and wherein said portion of said depletion region associated with said second impurity region has a width substantially less than an opposing width of said depletion region.

32. A semiconductor device comprising:

a first impurity region of a first conductivity type formed in a surface of a semiconductor region;

a second impurity region of a second conductivity type formed in said surface and spaced from said first impurity region;

an insulation film formed over said surface of said semiconductor region between said first and second impurity regions;

reverse-bias voltage applying means having one end thereof electrically connected to said first impurity region and another end thereof electrically connected to said second impurity region; and a junction-breakdown direction-control part selectively formed on said insulation film, where said junction-breakdown direction-control part controls the direction of junction breakdown in said semiconductor region between said first and second impurity regions;

wherein:
said part comprises a projection portion opposing said second impurity region;
said part one of:
suppresses an extent of a selected portion of a depletion region associated with said second impurity region substantially adjacent to said portion,
concentrates an electric field in said selected portion;
said portion has a width substantially less than an opposing width of said second impurity region; and
said portion being substantially aligned with an opposing edge of said second impurity region.

\* \* \* \* \*